(12) United States Patent
Huang et al.

(10) Patent No.: US 8,149,052 B2
(45) Date of Patent: Apr. 3, 2012

(54) METHOD AND APPARATUS TO LINEARIZE TRANSCONDUCTORS BY PREDISTORTION

(75) Inventors: Qiuting Huang, Zollikon (CH);
Dimitrios Filippos Papadopoulos, Zurich (CH); Jurgen Rogin, Meilen (CH)

(73) Assignee: ACP Advanced Circuit Pursuit AG, Zollikon (CH)

( * ) Notice: Subject to any disclaimer, the term of this patent is extended or adjusted under 35 U.S.C. 154(b) by 0 days.

(21) Appl. No.: 12/450,926

(22) PCT Filed: Apr. 17, 2008

(86) PCT No.: PCT/EP2008/003096
§ 371 (c)(1),
(2), (4) Date: Feb. 22, 2010

(87) PCT Pub. No.: WO2008/128706
PCT Pub. Date: Oct. 30, 2008

(65) Prior Publication Data
US 2010/0182091 A1    Jul. 22, 2010

(30) Foreign Application Priority Data

Apr. 18, 2007   (GB) ................................. 0707533.6

(51) Int. Cl.
*H03F 1/26* (2006.01)
(52) U.S. Cl. ........................................................ 330/149
(58) Field of Classification Search .................. 330/149; 327/359
See application file for complete search history.

(56) References Cited

U.S. PATENT DOCUMENTS

| | | | |
|---|---|---|---|
| 4,187,472 A | 2/1980 | Yum | |
| 4,342,006 A | 7/1982 | Ishigaki | |
| 6,040,731 A | 3/2000 | Chen et al. | |
| 6,121,818 A | 9/2000 | Kim et al. | |
| 6,205,325 B1 | 3/2001 | Groe | |
| 6,426,677 B1 | 7/2002 | Prentice | |
| 6,617,910 B2 * | 9/2003 | Quan | 327/359 |
| 6,985,033 B1 | 1/2006 | Shirali et al. | |
| 2005/0117071 A1 | 6/2005 | Johnson | |
| 2006/0014509 A1 | 1/2006 | Xu et al. | |
| 2007/0004368 A1 | 1/2007 | Lee et al. | |

FOREIGN PATENT DOCUMENTS

EP    1 081 573    3/2001

(Continued)

OTHER PUBLICATIONS

PCT International Search Report and Written Opinion dated Jul. 24, 2008 in related PCT Application No. PCT/EP2008/003096.

(Continued)

*Primary Examiner* — Steven J Mottola
(74) *Attorney, Agent, or Firm* — Stout, Uxa, Buyan & Mullins; Frank J. Uxa

(57) ABSTRACT

A transconductor for providing an output current that is linear in the input voltage (Vin) comprises a main output transconductor (Ms, Mc) and a model transconductor (Msr1, Msr2, Mcr1, Mcr2) that are controlled by the same signal (Vc, Vc'). The latter transconductor (Msr1, Msr2, Mcr1, Mcr2) is comprised in a predistortion circuit (A), which measures the output of the model transconductor and the overall voltage input (Vin) to provide a control signal (Vc, Vc') for the transconductors that compensates for their non-linearity.

31 Claims, 9 Drawing Sheets

FOREIGN PATENT DOCUMENTS

| WO | WO 96/23365 | 8/1996 |
|----|----|----|
| WO | WO 00/40039 A2 | 7/2000 |
| WO | WO 00/55964 | 9/2000 |
| WO | WO 2008/128706 | 10/2008 |

OTHER PUBLICATIONS

UK Search Report dated Jul. 11, 2007 in related application No. GB0707533.6.

Mekechuk et al., "Linearizing Power Amplifiers Using Digital Predistortion, EDA Tools and Test Hardware", *High Frequency Electronics*, Apr. 2004.

European Patent Office Examination Report dated Sep. 9, 2011 in European Patent Application No. 08 748 968.8-1233.

Office Action in related Chinese Patent Application No. 200880012668.0 dated Dec. 23, 2011 from the State Intellectual Property Office of P.R.C.

* cited by examiner

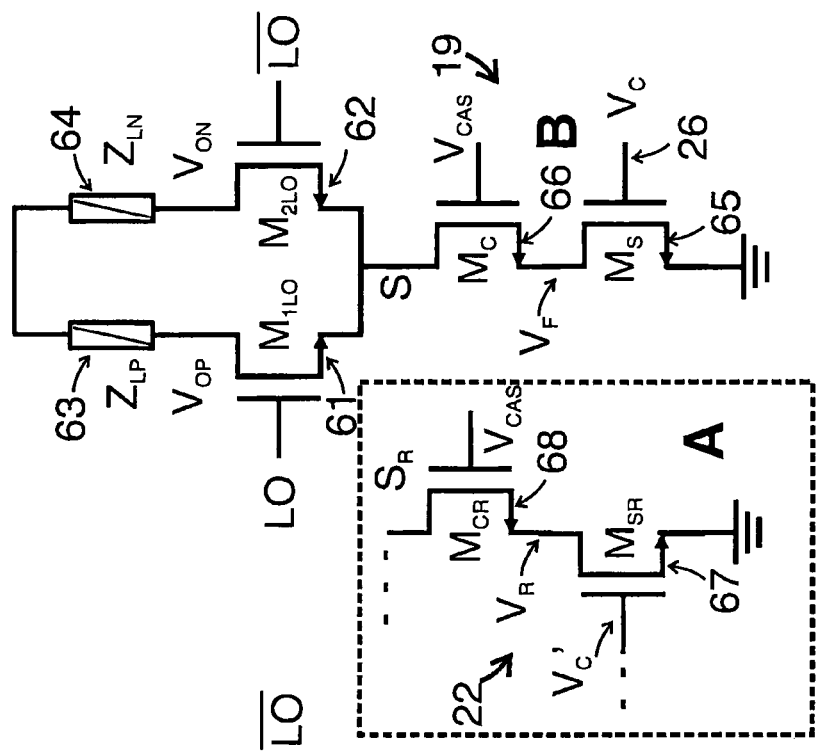
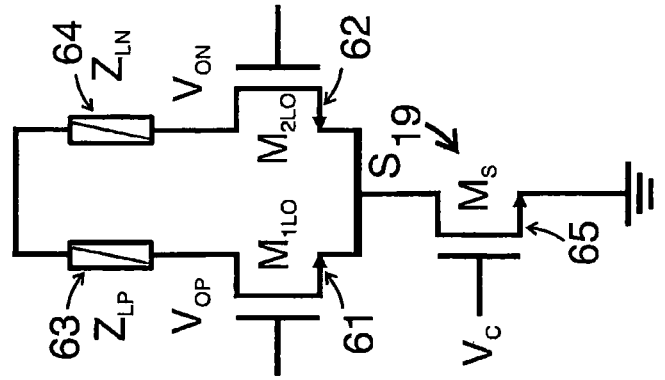
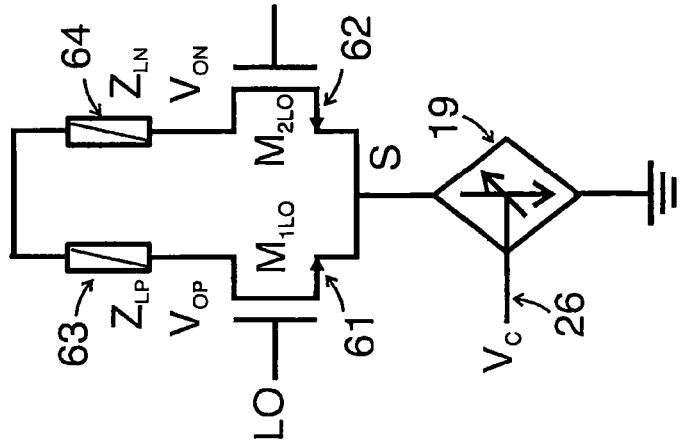
Figure 6c
Figure 6b
Figure 6a

METHOD AND APPARATUS TO LINEARIZE TRANSCONDUCTORS BY PREDISTORTION

FIELD OF THE INVENTION

This invention relates to the linearization of transconductors, which find applications in a wide variety of analogue circuits, including modulators for radio frequency transmitters, where the maximal achievable output signal-to-noise ratio is of particular importance.

BACKGROUND OF THE INVENTION AND RELATED ART

A voltage-controlled current source, or a transconductor, is an important building block in electronic circuits. Transistors, based on either the bipolar junction or field effect principle, essentially perform such a function. The voltage-to-current, or V-I, characteristics of transistors, however, are usually not sufficiently linear for large-signal applications such as a transmitting modulator. Linear impedances are therefore often combined with transistors to form linear transconductors. FIG. 1a shows a bipolar transistor with resistive emitter degeneration as a linear transconductor. When the product of the transistor's transconductance $g_m$ and the degenerating resistance R is much greater than unity the overall ratio between the output current $I_o$ and the input voltage $V_{in}$ is then given by 1/R, which is linear. Another example is given in FIG. 1b, where the combination of transistor T and amplifier OP makes the effective input impedance of the structure (seen from node 1) much smaller than the linear impedance Z, so that the output current $I_o$ is related to the control voltage $V_{in}$ and the bias current $I_B$ by either $I_o=I_B+(V_{in}-V_B)/Z$, if the said control voltage is applied to node 2 or $I_o=I_B-(V_{in}-V_B)/Z$, if the said control voltage is applied to node 3. In such and similar schemes the linear impedance Z is connected to the low impedance node of the transistor, that is, the emitter for the bipolar junction transistor or the source for the field effect transistor. This usually makes it necessary to bias the said emitter or source terminal of the current-source transistor away from a common reference point such as the ground terminal GND or a power supply $V_{DD}$, as the case may be, to allow voltage headroom for the necessary supporting circuitry. This headroom reduces the usable voltage swing at the output node (the collector or drain terminal of the transistor) compared to a transistor in common-source or common-emitter configuration, which we refer to as a grounded transconductor. In modern integrated circuits where the permissible supply voltage is very limited, the loss of available signal swing to the bias requirement of the linearizing circuitry is resistor(s), bias current source(s) and operational amplifier, the achievable signal-to-noise ratio for the output current can also be seriously degraded by the inevitable noise sources associated with such additional elements, as compared to a grounded transconductor, an example of which is depicted in FIG. 1c. In transmitter applications noise from such linearized transconductors is usually the cause for typical noise performance of the modulating mixer being two orders of magnitude worse than that which is required by applications such as GSM. Polar modulators (where no modulating mixers are required) are therefore overwhelmingly preferred over Cartesian modulators for this reason, despite the ease with which the latter modulator type can accommodate both amplitude and phase modulation schemes as required by the latest mobile communications standards such as wireless LAN, EDGE and UMTS.

SUMMARY OF THE INVENTION

According to the present invention there is provided a transconductor circuit comprising:
 an output transconductor having a control input and an output responsive to the signal at the control input, and
 a predistortion circuit comprising:
 a control input,
 a model transconductor, having an input voltage to output current characteristic where the output current is related to that of the output transconductor by a constant factor, which factor includes a factor of one, and having a control input and an output responsive to the signal at its control input,
 a feedback network
  that is connected to receive the signal at the control input to the predistortion circuit,
  that has a feedback input connected to receive a feedback signal indicative of the signal output from the output of the model transconductor, and has a control output connected to supply a transconductor control signal to the control input of the model transconductor and to the control input of the output transconductor, and
  that is responsive to the signal from the control input to the predistortion circuit and to the feedback signal indicative of the signal output from the output of the model transconductor, in providing the transconductor control signal, to control the output of the model transconductor to be linear with respect to the signal at the control input of the predistortion circuit The present invention also provides a transconductor circuit comprising:
 an output transistor having a control input and an output, and
 a predistortion circuit comprising:
 a control input,
 a replica transistor, being a replica or a scaled replica of the output transistor and having a control input and an output, and
 an amplifier connected to compare a signal at the control input to the predistortion circuit and a feedback signal indicative of the output from the replica transistor to provide a control signal to the control input of the replica transistor to control the output of the replica transistor to be linear with respect to the signal at the control input of the predistortion circuit, the control signal output from the amplifier also being connected to the control input of the output transistor.

The present invention also provides a method of controlling an output transconductor comprising:
 providing an output transconductor and a model transconductor having an input voltage to output current characteristic where the output current is related to that of the output transconductor by a constant factor, which factor includes a factor of one,
 receiving an input control signal,
 sensing the output of the model transconductor,
 providing, in response to the input control signal and to a signal indicative of the output of the model transconductor, a transconductor control signal to control the output of the model transconductor to be linear with respect to the input control signal, and
 applying the said transconductor control signal to the output transconductor to control the output thereof.

Preferred features of the invention are defined in further, claims of those appended hereto.

An advantage of the present invention is to linearize the voltage-to-current transfer characteristic of a nonlinear transconductor device. When the transconductor is a transistor the invention allows (but does not demand) the transistor to be connected in common-source or common emitter configuration, which maximizes the signal range as well as the signal to noise ratio at the output of the transconductor.

The invention uses a model transconductor, preferably in the form of a replica transconductor, which can be arranged, for example, among transconducting devices produced in the same batch during integrated circuit fabrication. Such devices can be designed to be practically identical to each other. Scaled replica versions of transconducting devices such as transistors have scaled V-I transfer functions. Deviation of a transconductor's V-I transfer curve from a straight line is sensed by the model transconductor having its control terminal connected in common with that of the main transconductor but having its current output connected to a separate node. Sensing and correcting the model transconductor can be achieved without affecting the output signal range and noise behavior of the main transconductor. The information derived from the model on the necessary voltage correction to its control terminal is then used for the main transconductor.

Preferably, the predistorter comprises linear impedances that help convert either the output current of the said model into voltage or the input voltage to the predistorter into current, so that the said input voltage and the said model output current can be compared by a feedback circuitry that accordingly adjusts the control voltage of the model transconductor until the difference is practically zero. The said control voltage for the model transconductor can then be used either directly or, preferably after additional signal conditioning, as the output of the predistorter. The said output of the predistorter can be applied to a single main transconductor or alternatively several main transconductors sharing similar V-I characteristics.

In an advanced embodiment of the invention, signals within the main transconductor that reflect its operating (including load) conditions, including its output voltage or current, are sensed and fed (back) to the predistorter, whereupon additional servo mechanisms act to ensure that the model transconductor inside the predistorter match the main transconductor in those operating conditions.

An advantage of the invention is that very linear radio modulators can be realized and moreover this can be done without sacrificing noise performance, so that expensive surface acoustic wave (SAW) filters are not needed to improve the modulator's output noise spectral density. More particularly the circuit provided can all be fabricated using integrated circuit technology, preferably in a single integrated circuit.

The invention is of use, amongst other things, in mobile telephones or in any other kind of mobile terminal station, for example, PDAs with wireless mobile data connectivity or a similarly enabled laptop computer; in the latter case wireless connection is provided, for example, in a PC card, which may send data using GPRS, EDGE, or UMTS services.

Preferred embodiments of the present invention will now be described in greater detail, by way of example only, with reference to the accompanying drawings, of which:

FIG. 6a is a diagram of a single-balanced mixer employing a grounded transconductor.

FIG. 6b is a schematic diagram of a single-balanced mixer with grounded transconductor realized by a single-transistor $M_S$.

FIG. 6c is a schematic diagram of a single-balanced mixer with the grounded transconductor realized by the cascode of two transistors, $M_C$ and $M_S$.

DETAILED DESCRIPTION OF THE INVENTION

Figure 1:
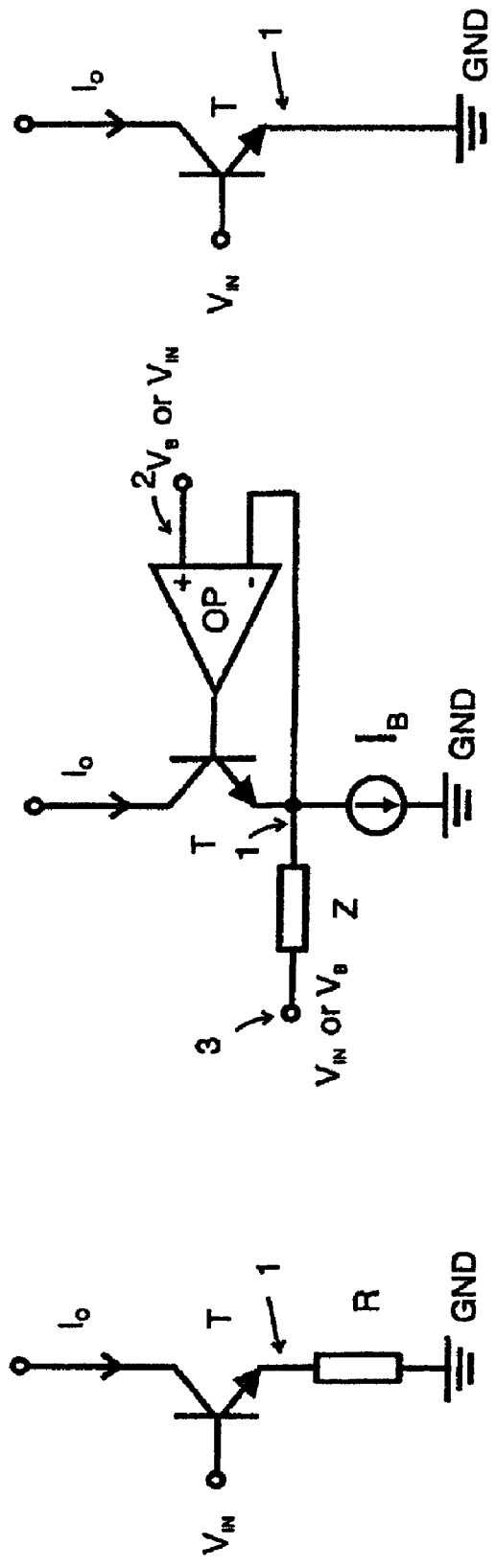
FIG. 1a is a schematic diagram of a prior-art emitter-degenerated transconductor.
FIG. 1b is a schematic diagram of a prior-art, amplifier-regulated folded cascode transconductor.
FIG. 1c is a schematic diagram of a prior-art, common-emitter transconductor.
Figure 2:
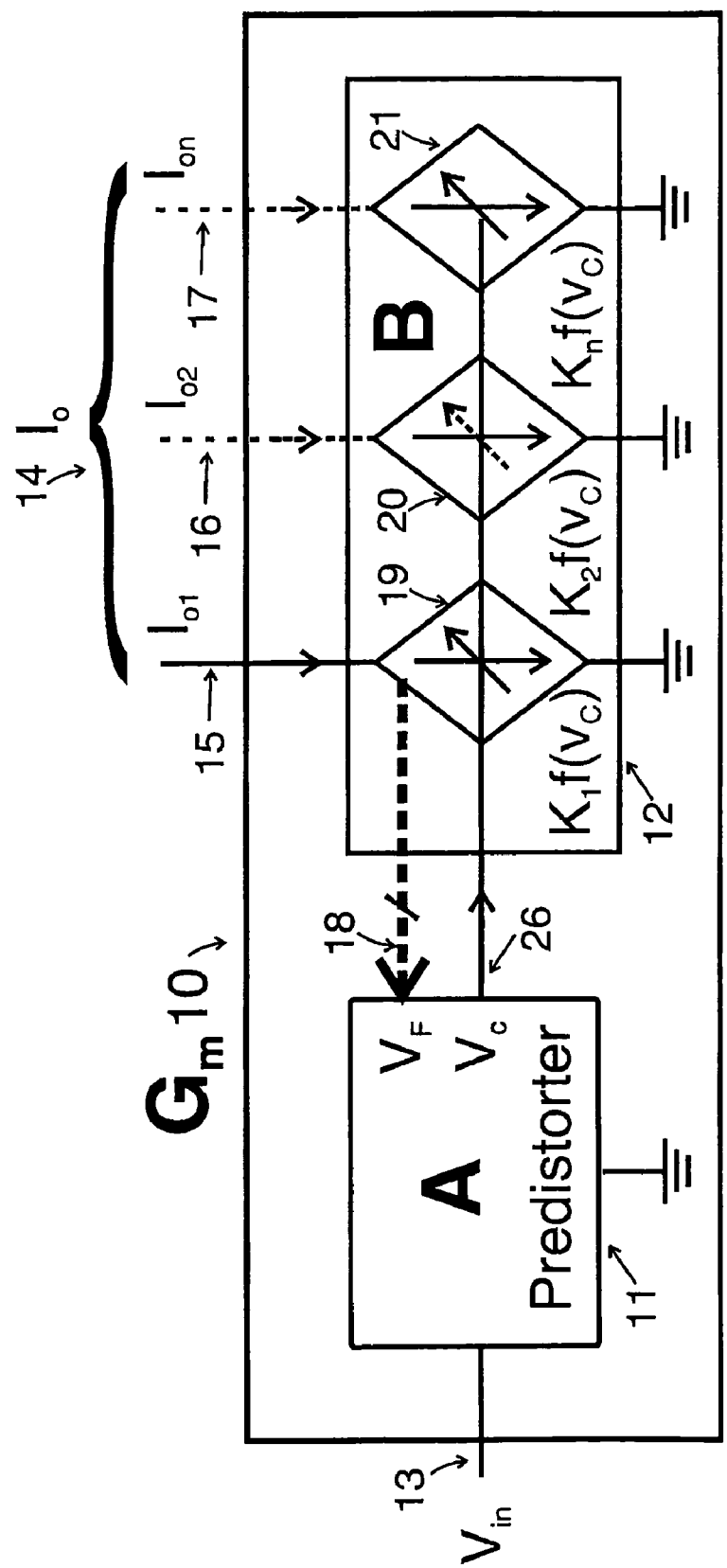
FIG. 2 is a general block diagram of a predistorted linear transconductor circuit, according to the present invention.

A predistorted linear transconductor $G_m$ 10 in accordance with the invention comprises, as shown generally in block diagram form in FIG. 2, a predistorter A 11 and a transconductor B 12. At its boundary the overall linear transconductor $G_m$ 10 has an overall input port $V_{in}$ 13 and an overall output port $I_o$ 14 that comprises an output current $I_{o1}$ 15 or that may comprise several output currents $I_{o1}$ to $I_{on}$ 15, 16, 17 that are scaled copies of one another, provided for example by multiple transconductors 19, 20, 21 in block B that are connected to the same control voltage 26. Since reference to one such output current or transconductor is sufficient in illustrating the present invention to those skilled in the art, from now on only a single transconductor 19 and its output current $I_o$ 15 in block B will generally be referred to in the descriptions to follow. The input port $V_{in}$ of $G_m$ receives the signal voltage to be converted into current. The output port $I_o$ provides the desired current(s) that are linearly related to $V_{in}$ by a constant transconductance.

The input port $V_{in}$ 13 is provided by the input of the predistorter A 11. Predistorter A receives input signal $V_{in}$ and, in certain embodiments, examples of which are given later, may have additional input port(s) $V_F$ 18 to receive feedback signal(s) from transconductor B that contain information about B's operating conditions (e.g. loading conditions). In response to both the input signal $V_{in}$ and, when applicable, feedback signals $V_F$, predistorter A 11 produces its output signal $V_C$ 26 according to the characteristics of its internal circuitry that includes a model transconductor. The said output signal $V_C$ of predistorter A is applied to the input port of transconductor B 12, which is also its voltage control port 26.

The output port $I_o$ 14 is provided by the output of the transconductor B 12. Transconductor B receives its input signal $V_C$ 26 from predistorter A 11 and, when applicable, also provides feedback signal or signals $V_F$.

Figure 3:
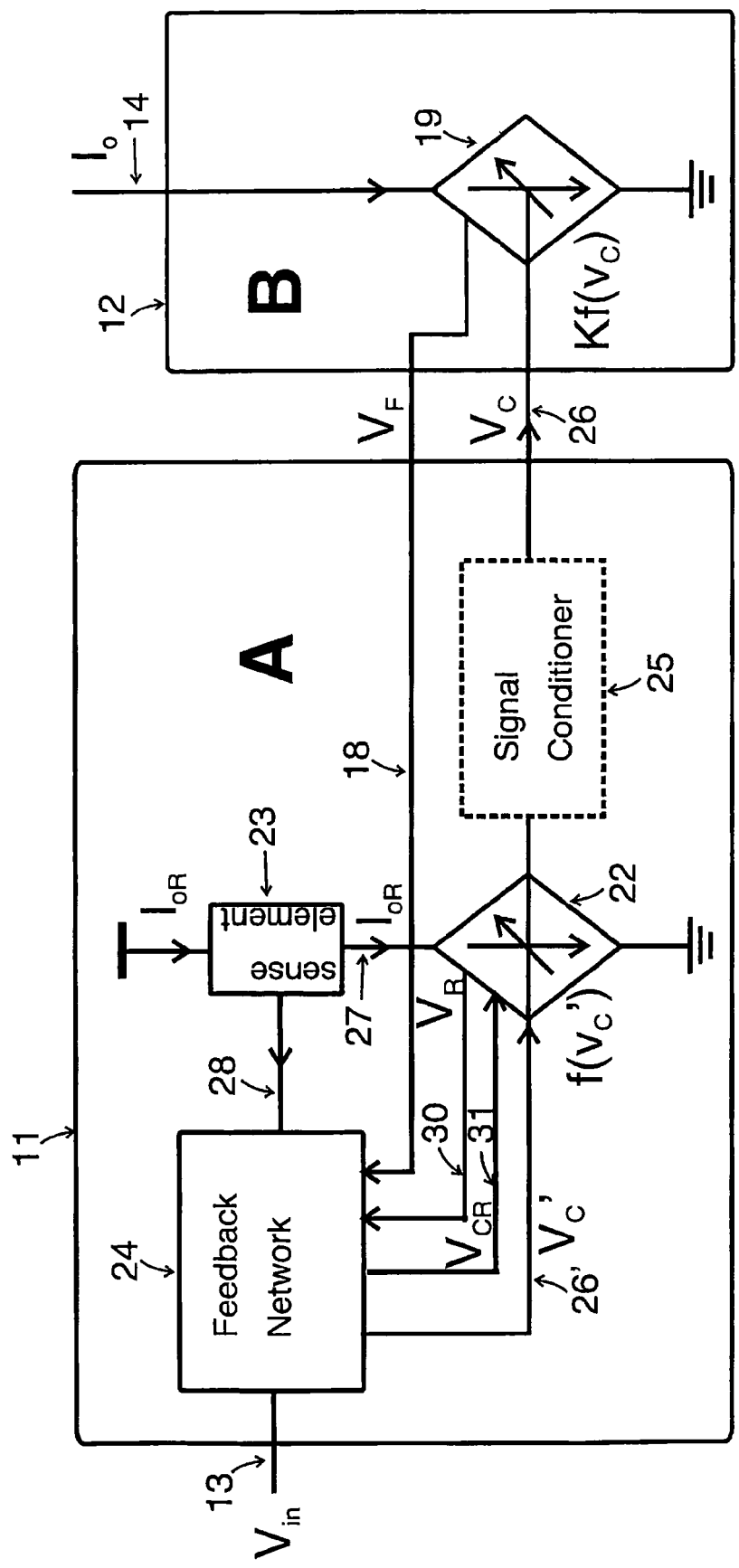
FIG. 3 is a more detailed block diagram of the predistorted linear transconductor circuit, according to the present invention.

Details of blocks A and B now follow. FIG. 3 shows a preferred general construction of the predistorter A in block diagram form. Predistorter A includes a model transconductor 22, at least one sensing element 23 for the output current of the said model transconductor, a feedback network 24 and, optionally a signal conditioning circuit 25. The model transconductor receives its control voltage $V_C'$ 26' from the feedback network and provides its output current $I_{oR}$ 27 to the sensing element. The output 28 of the sensing element is fed into the feedback network 24, which compares it with the input voltage $V_{in}$ 13. One of the output signals of the feedback network is the control voltage $V_C'$ 26'. In certain preferred embodiments the feedback network also compares signal or signals $V_F$ 18 from the transconductor in block B with its counterpart $V_R$ 30 of the model transconductor (i.e. the signals $V_F$ and $V_R$ indicate the same operating condition in the two transconductors, for example by taking $V_R$ from the same node in the transconductor 22 as that from which $V_F$ is taken in transconductor 19) and feeds back control signal $V_{CR}$ 31 to reduce any difference between $V_F$ 18 and $V_R$ 30. (Note that the operating condition $V_F$ and $V_R$ is not limited to being a voltage as the V symbols suggest; it may, for example, be a current.)

In most applications the control signal $V_C'$ 26' can be used directly as the output $V_C$ 26 of block A. In some preferred embodiments, however, additional signal conditioning is performed on $V_C'$ by signal conditioning block 25 and the output of that is used as $V_C$. Block B contains one (or more) transconductor having a V-I characteristic that has the output current K times that of the model transconductor inside block A for the same control voltage. The control voltage for the transconductor in block B is $V_C$ and its output current is $I_o$. In some preferred embodiments terminal $V_F$ is led out of block B and that contains information on the operating (e.g. loading) conditions of the main transconductor. (Note that for reasons of reducing power consumption in block A factor K will usually be greater than one, but the invention works equally well where K is one or less than one.)

Figure 4:
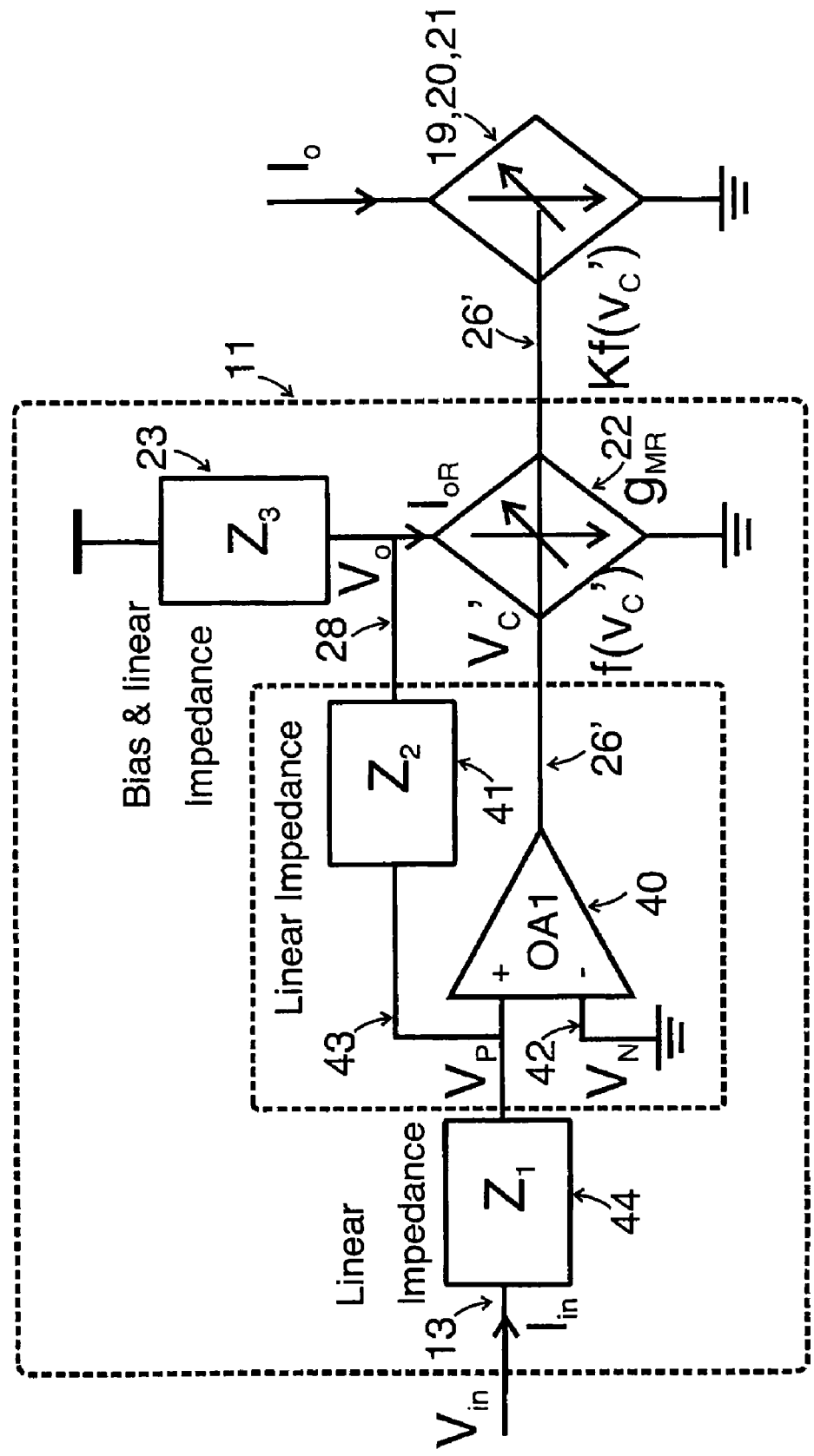
FIG. 4 is a block diagram of a first exemplary implementation of the predistorted linear transconductor circuit, according to the present invention.

A first exemplary implementation of the predistorter A 11 is depicted in FIG. 4. This is in single ended form, but this can be easily converted to an equivalent differential implementation by those skilled in the art. The circuit comprises a model transconductor 22 having a current input connected to ground and a voltage control input, a linear load impedance $Z_3$ 23 (forming the sense element and providing a bias to the model transconductor 22) connected between the current output of the model transconductor 22 and the power supply, and an operational amplifier OA1 40. The amplifier has its output 26' connected to the voltage control input of the model transconductor 22 and, as the output of the predistorter, to the voltage control input of the main transconductor 19 that is to be controlled. A linear feedback impedance $Z_2$ 41 is connected between the output node $V_o$ 28 of the model transconductor 22 and the non-inverting input 43 of the operational amplifier 40, which has its inverting input 42 connected to ground. A linear input impedance $Z_1$ 44 is connected between the input for $V_{in}$ and the non-inverting input 43.

Amplifier OA1 40, model transconductor $g_{MR}$ 22 and linear impedance $Z_2$ 41 form a negative feedback loop (the transconductor providing in this case the inversion to make the feedback negative) that effectively forces the amplifier's differential input voltage to zero. Both the inverting input $V_N$ 42 and the noninverting input $V_P$ 43 of OA1 40 are therefore held to a constant bias voltage or AC ground, so that the current $I_{in}$ flowing through linear impedance $Z_1$ 44 is proportional to the input voltage $V_{in}$. The same current will flow through linear impedance $Z_2$ if the input impedance of OA1 is infinite or much higher than $Z_2$. According to Kirchhoff's current law applied to node $V_o$ 28, the output of the model transconductor 22, the current $I_{oR}$ out of the model transconductor is related to the input voltage by $I_{oR}=(1+Z_2/Z_3)V_{in}/Z_1+C=f(V_C')$, where C is a constant representing any signal independent bias current. It follows that the output current of the main transconductor is given by $I_o=Kf(V_C')=KI_{oR}=K(1+Z_2/Z_3)V_{in}/Z_1+KC$, which is linear in the input voltage.

In many applications the desired signal is limited in frequency within a prescribed band. Outside the desired signal band spurious signals and particularly noise should be minimized. A radio transmitter is one such example. Since the predistortion principle according to the present invention only needs to be effective for the desired signal to be output by the main transconductor 19 and the predistorted control signal $V_C'$ is also bandlimited, a signal conditioner can be employed, as shown at 25 in FIG. 3, between the control terminal $V_C'$ 26' of the model transconductor and that of the main transconductor, $V_C$ 26, to remove some of the spurious signal and noise components unrelated to the desired signal. In particular, any out-of-band noise that is present in the predistorter output can be effectively removed without affecting the conversion of desired input voltage into a linear current. Note that since it corrects the non-linearity of the main transconductor 19 the signal $V_C'$ generally contains information in a wider bandwidth than that of the desired signal and this information is passed by the conditioner to the main transconductor (or as much of it as will provide the desired degree of linearity). Thus signals $V_C'$ and $V_C$ are essentially the same, only with the latter having the spurious signal removed.

Figure 5A:
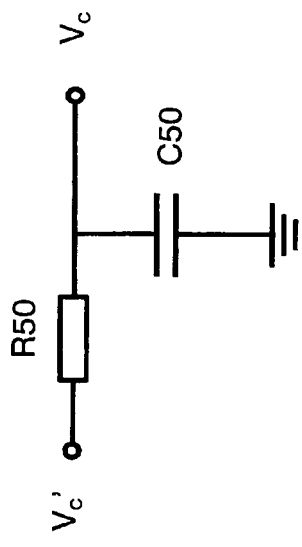
FIG. 5a is a circuit schematic of a first exemplary implementation of the signal conditioning block in the pre-distorter A.
Figure 5B:
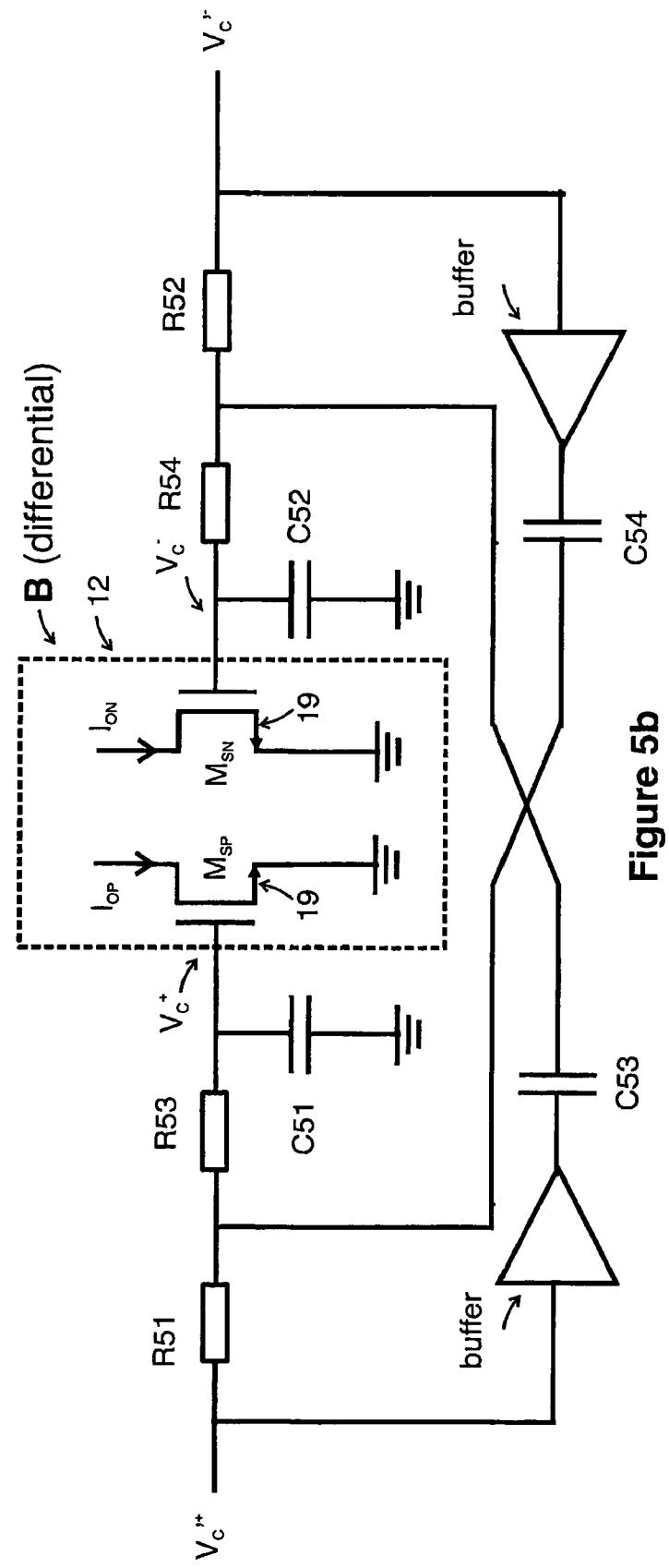
FIG. 5b is a schematic diagram of a second exemplary implementation of the signal-conditioning block in the pre-distorter A.

FIG. 5a shows an example of the signal conditioner, which is a simple R-C lowpass filter comprising a resistor R50 connected between its input and its output and a capacitor C50 connected between ground and the output. FIG. 5b shows another example of the signal conditioner, in which both the predistorter and the main transconductor are realized in (pseudo) differential form, and additional high frequency attenuation is realized by feeding forward a highpass filtered version of control voltage to the opposite side of the differential transconductor input. In this example the main transconductor is provided by two FET transistors 19 having gates controlled respectively by the filtered differential control signals $V_C^+$ and $V_C^-$. These are provided by respective lowpass RC filters (R53, C51 and R54 and C52) having the same form as in FIG. 5a, which filter respective ends $V_C'^+$ and $V_C'^-$ of the control signal 26' provided in differential form by feedback network 24 via a respective resistor R51 and R52. Each end of the unfiltered control signal is also buffered by a respective buffer amplifier and high pass filtered by a respective capacitor C53 and C54 and is injected into the node on the other side between the input resistor and the resistor of the low pass filter.

The linearized transconductor according to the present invention finds use in a variety of applications, including linear modulators in which the transconductor is followed by commutating switches that are driven by a local oscillator signal LO, as illustrated in FIG. 6a. In FIG. 6a the output of the main transconductor 19 is connected to the common node S of the commutating switches and is controlled by the output $V_C$ 26 of the predistortion circuit. The switches are provided by FETs $M_{1LO}$ and $M_{2LO}$ (61 and 62) which switch the output current of the transconductor to respective load impedances $Z_{LP}$ and $Z_{LN}$ (63 and 64) in response to complementary local oscillator signals LO, $\overline{\text{LO}}$. Through the switches the linear current output by the transconductor is modulated by the LO to the radio carrier frequency making it suitable for transmission. The voltage on the common node S of the pair of switches $M_{1LO}$ and $M_{2LO}$, connected in this instance to the output node of the main transconductor, follows a trajectory determined by both the complementary LO signals and the load impedances $Z_{LP}$ and $Z_{LN}$. The resulting voltage swing can be very substantial, which subjects the output of the main transconductor 19, sometimes realized as a single transistor $M_S$ 65 as shown in FIG. 6b, to considerably different boundary conditions from those of its model inside the predistorter A. To reduce the impact of this load signal swing on the linearity of bottom transistor $M_S$ that performs the basic transconducting function, a cascode transistor $M_C$ 66 is usually placed between the drain (or collector) of $M_S$ and the load, or, in the case of the modulator, the common node S of the switch pair. This is shown in FIG. 6c. A corresponding cascode transistor $M_{CR}$ 68 is preferably also inserted into the model transconductor inside the predistorter to maintain similarity. (The model transconductor also comprises, in this example, a transistor 67 controlled by the control signal 26/26' similar to that 65 of the main transconductor again for similarity.)

Figure 7:
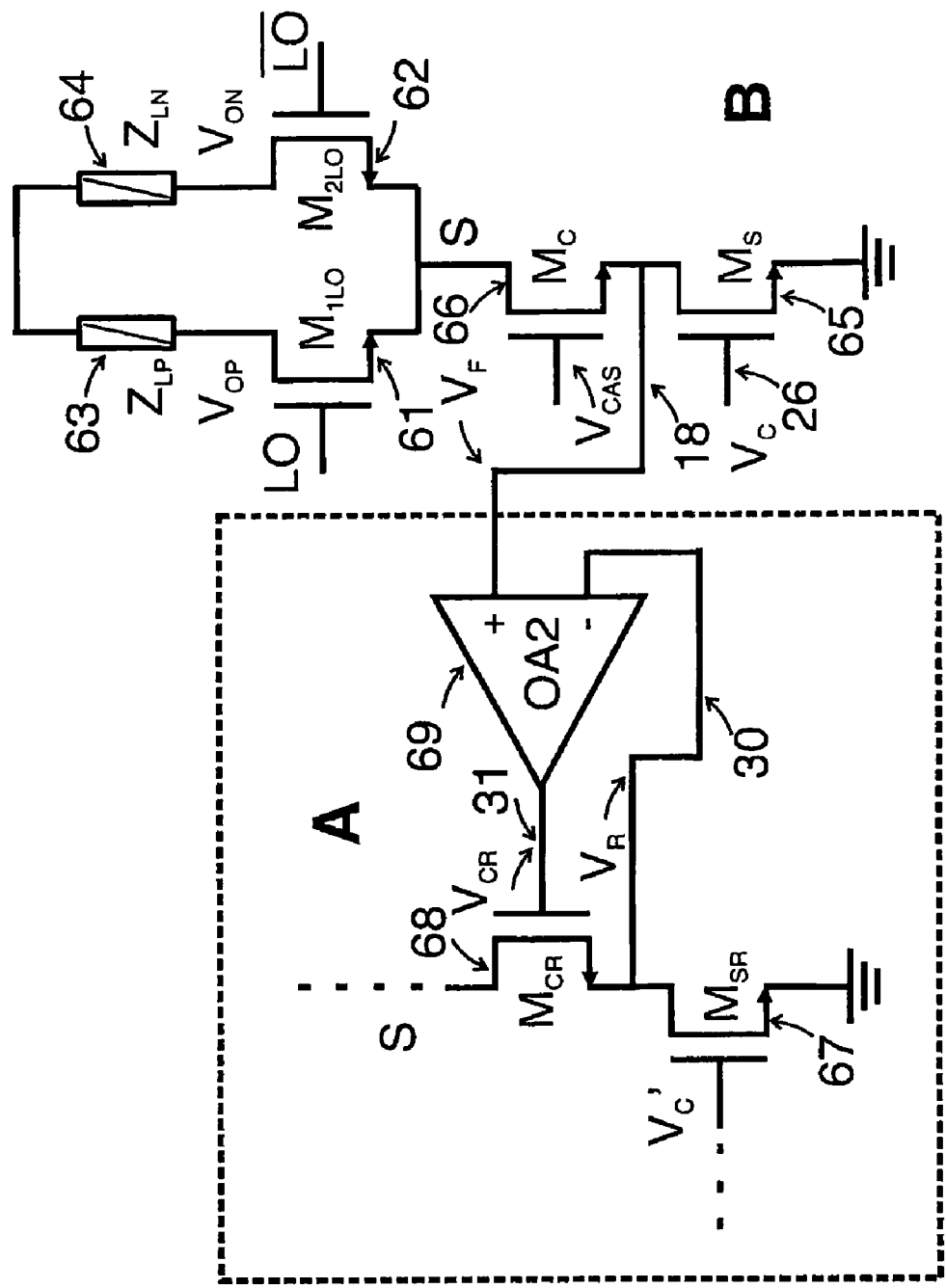
FIG. 7 is a schematic diagram of a single-balanced mixer, incorporating a linearized transconductor according to the present invention, in which feedback concerning an operating condition of an output transconductor is provided to a model transconductor in the predistorter.

The incorporation of a cascode transistor, however, is often still not enough to force the drain terminals of the bottom transistors $M_S$ in the main transconductor and $M_{SR}$ in the model transconductor to be sufficiently similar for very high linearity requirements. To improve the tracking between the said drain terminals a servo mechanism can be introduced, which forces the drain terminal of $M_{SR}$ to track that of $M_S$. FIG. 7 shows a preferred example of the said servo mechanism. The drain terminal $V_F$ 18 of $M_S$ is connected to the non-inverting input of operational amplifier OA2 69 while that of $M_{SR}$, $V_R$ 30, is connected to the inverting input of OA2. The output of OA2, $V_{CR}$ 31, is connected to the gate of cascode transistor $M_{CR}$ in the model transconductor, closing a negative feedback loop that forces OA2's two inputs, thus the drain voltages of $M_S$ and $M_{SR}$, to be virtually identical. Generally, depending on the exact implementation of the transconductor, one or more nodes of the transconductor can be sensed by a negative feedback network, for voltage or current signals that reflect the operating (including load) conditions of the main transconductor, in order to maintain similar conditions in the model transconductor.

Since the main transconductor can be used in circuits where additional signals are applied at the load side, as in the case of the modulating mixer in FIG. 6, its output voltage may contain signal components at different frequencies from those of the predistorter input $V_{in}$. When such 'out-of-band' frequency components are sensed by the secondary feedback loop introduced in FIG. 7, they may also propagate through the main feedback loop in the predistorter, such as that depicted in FIG. 4, and circulate to the control node of the model transconductor, $V_C'$, in which case their presence in $V_C'$ can be essential for maintaining, to a desired degree of linearity, the linear relationship between the model output current and the predistorter input. To preserve similarity between the model and the main transconductor, the latter's control voltage $V_C$ must also receive the same, 'useful', out-of-band components as $V_C'$ (recall that to correct the non-linearity the useful correcting signals in $V_C/V_C'$ will usually have a greater bandwidth than those that it is desired to output from the main transconductor). This can make it difficult, however, to insert a signal conditioning block between $V_C'$ and $V_C$ to remove undesired out-of-band signals, such as noise, without removing part of the useful out-of-band signal for pre-distortion or introducing a delay that affects its effectiveness.

Figure 8:
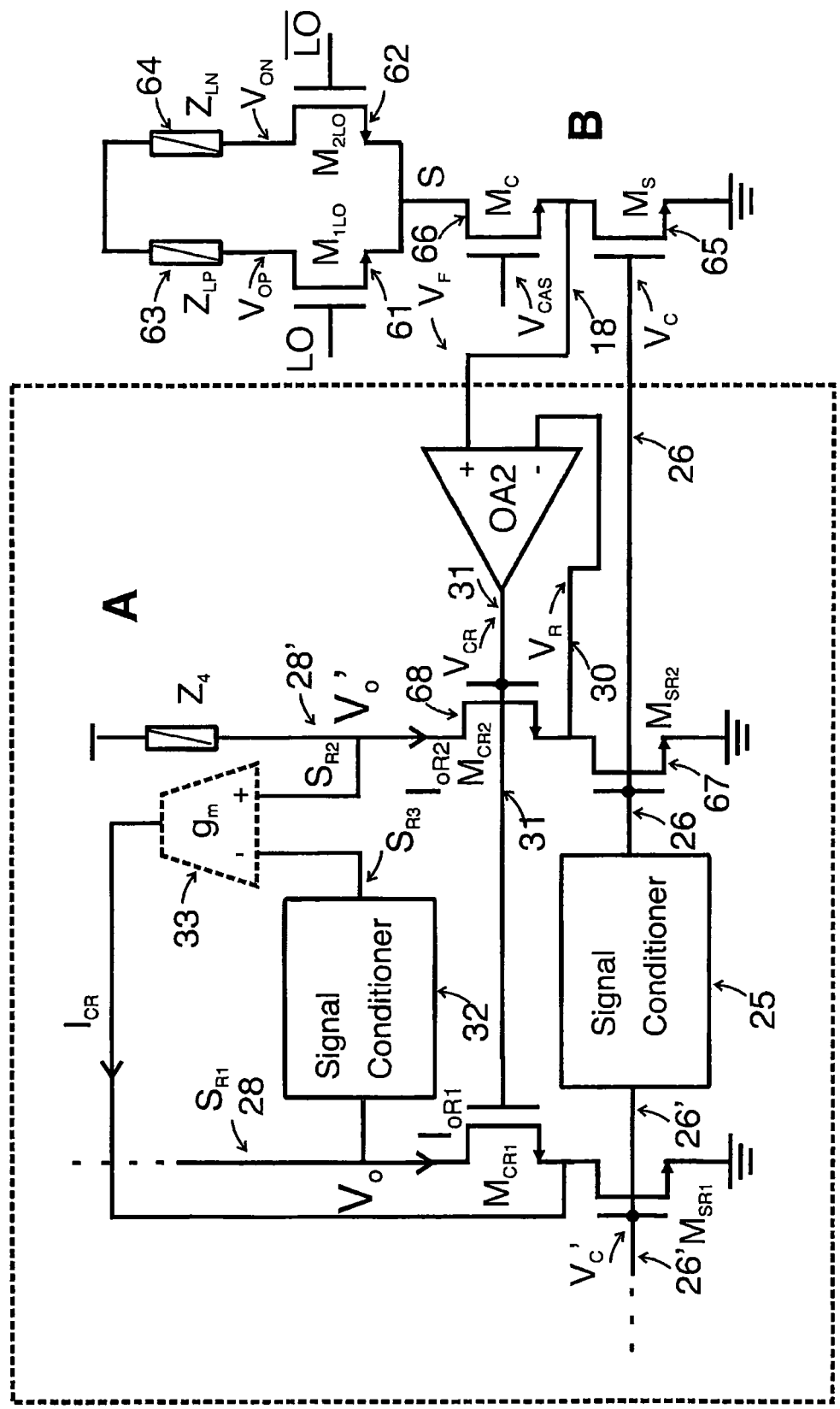
FIG. 8 is a schematic diagram of a single-balanced mixer, incorporating a linearized transconductor according to the present invention, in which both feedback of an operating condition from a main transconductor to a model transconductor and a signal conditioner are employed.

Two or more model transconductors can be used to overcome such limitation and allow pre-distortion and feedback servo to be realized separately within predistorter A. FIG. 8 shows an example of the predistorter in which that is done. A first model transconductor (realized by $M_{SR1}$ and $M_{CR1}$ in this example) is embedded in the main feedback loop described in FIGS. 3 and 4, whereas a second model transconductor (realized by $M_{SR2}$ and $M_{CR2}$) is embedded in the feedback servo loop depicted in FIG. 7. The signal-conditioning block 25 depicted in FIG. 3 is now placed between the control terminal of the said first model transconductor and that of the second, where it blocks any spurious out of band signals present in the predistorter, for example, caused by spurious out of band signals in $V_{in}$.

To impose a linear V-I transfer function on the main transconductor $M_S$, in this example the second model transconductor $M_{SR2}$, which shares the same control voltage, is arranged to derive its current in linear relationship to the overall input voltage to the predistorter, $V_{in}$. This is achieved, in this example, by using a secondary feedback loop to lock the output voltage of the said second model transconductor, $V_o'$, to that of the said first model, $V_o$. That there is this linear relationship is explained as follows. First, as noted above, the current $I_{oR1}$ is linear in $V_{in}$. Now, since sense element 23/impedance $Z_3$ is linear and the current passing through it, $I_{oR1}+V_{in}/Z_1$, is linear in $V_{in}$, it follows that voltage that it sets, $V_o$, is also linear in $V_{in}$. Further, since $V_o'$ is servoed to $V_o$ it follows that $V_o'$ is also linear in $V_{in}$. Finally since $Z_4$ is linear and the voltage $V_o'$ defining the current, $I_{oR2}$, through it is linear in $V_{in}$ it follows that that current, $I_{oR2}$, is also linear in $V_{in}$. So with $I_{oR2}$ being linear in $V_{in}$ so is the current output from the main transconductor 65, 66 because both main transconductor and the second model transconductor have their control terminals connected to the same voltage.

The servo function is performed in this example by an amplifier $g_m$ 33 having its positive input connected to receive $V_o'$, its negative input connected to receive $V_o$ and its output connected to provide a current to the node between the transistors of the first model transconductor. This current affects in turn $I_{oR1}$, $V_o$, $V_P$ and $V_C/V_C'$ hence adjusting $V_o'$.

Now, as mentioned above the second model transconductor is kept in the same operating environment as the main transconductor 65, 66 by the servo loop comprising OA2. The output of that servo loop is however also applied to the first model transconductor in the same way that it is applied to the second model transconductor so that the first model, as well as the second, is also kept in the same operating environment as the main transconductor, with the result that out of band signals that impinge on the operating environment of the main transconductor, for example the local oscillator signals LO, are taken into account by the feedback network 24 (implemented by OA1 etc.), which has $V_o$ as one of its inputs, in the production of the transconductor control signal 26, 26'.

Thus it may be seen that for both model transconductors in this example their output currents are each linear in the input $V_{in}$. Furthermore $V_o$ may also be seen to be a signal indicative of either and each of the linear output currents $I_{oR1}$ and $I_{oR2}$ of the two model transconductors (since $V_o$ and $V_o'$ are servoed together).

Optionally and preferably a second signal conditioner block 32, preferably identical to the main signal conditioner block 25, is connected to the output $V_o$ of the first model transconductor and $V_o'$ is locked to the output of the said second signal conditioning block, so that both the input and output voltages of the second model are similar to those of the first model except for a common delay introduced by the two signal conditioners, the feedback amplifier $g_m$ 33 now comparing $V_o'$ with the version of $V_o$ output by the said second signal conditioner. As well as providing the mentioned symmetrical delay the second conditioner avoids trying to drive $V_o'$ via the servo mechanism (provided by amplifier 33) with signal components that would not be passed anyway via signal conditioner 25 (which is on the path by which amplifier 33 influences $V_o'$).

Figure 9:
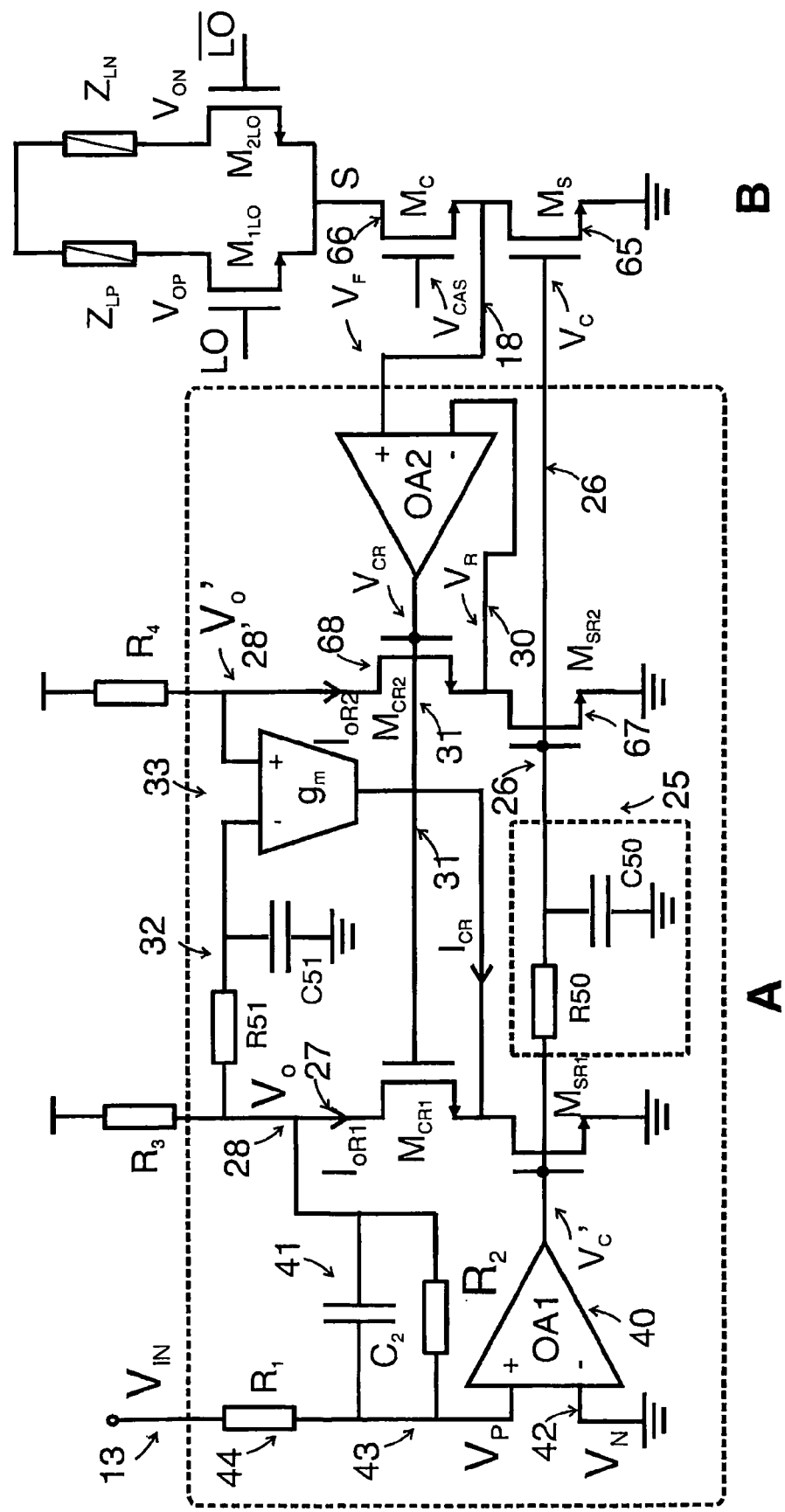
FIG. 9 is a schematic diagram, in single-ended notation, of a preferred embodiment of a single-balanced mixer that incorporates a preferred embodiment of the linearized transconductor according to the present invention.

FIG. 9 shows in schematic diagram the preferred implementation of a single-balanced mixer incorporating a linearized transconductor according to the present invention, where the deployed circuits are illustrated in single-ended forms for clarity. Converting these into fully differential forms, and indeed further in the context of a double balanced mixer with pseudo-differential transconductors, is straightforward to those skilled in the art.

While some of the preferred embodiments have been shown and described, it is to be understood that many changes and modifications can be made thereunto without departing from the invention as described in the appended claims.

Typically the circuits described above are provided in an integrated circuit.

As will be apparent from the above, the invention is based on scaled (or identical) V-I characteristics for the main and model transconductors. It has also been noted that the transconductors are preferably implemented as transistors. Now, it is known that when a circuit uses transistors that need to have scaled (or identical) characteristics the usual way to do that is to provide scaled replica transistors having scaled (or identical) physical geometries. It is also known that these replicas can be made to a high degree of similarity if they are produced in the same integrated circuit, preferably orientated in the same direction. The invention is, however, not limited to transconductors in the form of replica transistors but is applicable to any way of providing transconductors with scaled V-I characteristics.

When the transconductors are implemented using transistors, those may be for example bipolar or field effect transistors. The invention also applies to other kinds of transconductor.

The invention claimed is:

1. A transconductor circuit comprising:
   an output transconductor having a control input and an output responsive to the signal at the control input, and
   a predistortion circuit comprising:
   a control input,
   a model transconductor, having an input voltage to output current characteristic where the output current is related to that of the output transconductor by a constant factor, which factor includes a factor of one, and having a control input and an output responsive to the signal at its control input,
   a feedback network
   that is connected to receive the signal at the control input to the predistortion circuit,
   that has a feedback input connected to receive a feedback signal indicative of the signal output from the output of the model transconductor, and has a control output connected to supply a transconductor control signal to the control input of the model transconductor and to the control input of the output transconductor, and
   that is responsive to the signal from the control input to the predistortion circuit and to the feedback signal indicative of the signal output from the output of the model transconductor, in providing the transconductor control signal, to control the output of the model transconductor to be linear with respect to the signal at the control input of the predistortion circuit, and
   a conditioner circuit having an input connected to receive the transconductor control signal and an output connected to provide a conditioned version of that signal to the output transconductor, wherein the model transconductor is connected to receive the transconductor control signal before it is passed through the conditioner circuit.

2. A transconductor circuit as claimed in claim 1 wherein the predistortion circuit comprises a sense element connected to sense the signal output from the model transconductor and to provide the feedback signal.

3. A transconductor circuit as claimed in claim 2 wherein the sense element comprises a linear impedance connected to pass the current output from the model transconductor.

4. A transconductor circuit as claimed in claim 1 wherein the feedback network comprises a portion that is connected to pass the feedback signal and that has a linear impedance.

5. A transconductor circuit as claimed in claim 1 wherein the feedback network comprises a portion that is connected to pass the signal at the input of the predistortion circuit and that has a linear impedance.

6. A transconductor circuit as claimed in claim 1 wherein the feedback network comprises an amplifier connected to receive the feedback signal and the signal at the input of the predistortion circuit and having an output providing the transconductor control signal.

7. A transconductor circuit comprising:
   an output transconductor having a control input and an output responsive to the signal at the control input, and
   a predistortion circuit comprising:
   a control input,
   a model transconductor, having an input voltage to output current characteristic where the output current is related to that of the output transconductor by a constant factor, which factor includes a factor of one, and having a control input and an output responsive to the signal at its control input,
   a feedback network
   that is connected to receive the signal at the control input to the predistortion circuit,
   that has a feedback input connected to receive a feedback signal indicative of the signal output from the output of the model transconductor, and has a control output connected to supply a transconductor control signal to the control input of the model transconductor and to the control input of the output transconductor, and
   that is responsive to the signal from the control input to the predistortion circuit and to the feedback signal indicative of the signal output from the output of the model transconductor, in providing the transconductor control signal, to control the output of the model transconductor to be linear with respect to the signal at the control input of the predistortion circuit, and
   a conditioner circuit having an input connected to receive the transconductor control signal and an output connected to provide a conditioned version of that signal to the output transconductor, wherein the conditioner circuit comprises a low pass filter.

8. A transconductor circuit as claimed in claim 7 wherein the conditioner circuit comprises two low pass filters connected to receive respective ones of a pair of inputs, the transconductor control signal being represented by the difference in voltage between those inputs, and to provide respective outputs, and comprises two high pass filters each connected to receive the signal input to a respective one of the low pass filters and to inject a high pass filtered version of that into the input of the other low pass filter.

9. A transconductor circuit comprising:
an output transconductor having a control input and an output responsive to the signal at the control input, and
a predistortion circuit comprising:
a control input,
a model transconductor, having an input voltage to output current characteristic where the output current is related to that of the output transconductor by a constant factor, which factor includes a factor of one, and having a control input and an output responsive to the signal at its control input,
a feedback network
that is connected to receive the signal at the control input to the predistortion circuit,
that has a feedback input connected to receive a feedback signal indicative of the signal output from the output of the model transconductor, and has a control output connected to supply a transconductor control signal to the control input of the model transconductor and to the control input of the output transconductor, and
that is responsive to the signal from the control input to the predistortion circuit and to the feedback signal indicative of the signal output from the output of the model transconductor, in providing the transconductor control signal, to control the output of the model transconductor to be linear with respect to the signal at the control input of the predistortion circuit, and
a servo circuit connected to sense an operating condition of the output transconductor and to apply that operating condition to the model transconductor.

10. A transconductor circuit as claimed in claim 9 comprising:
two model transconductors each having a control input connected to receive the control signal from the predistortion circuit,
a signal conditioner having an input connected to receive the transconductor control signal and an output connected to provide a conditioned version of that signal to the output transconductor, a first one of the model transconductors having its control input connected to receive the version of the transconductor control signal prior to the conditioner, and a second one of the model transconductors having its control input connected to receive the conditioned version of the transconductor control signal,
a second servo circuit connected to sense the voltage at the output of the first model transconductor and the voltage at the output of the second signal conditioner, and to control the voltage at the output of the second signal conditioner to be the voltage at the output of the first model transconductor,
wherein the first servo circuit also applies the said operating condition to both the first model transconductor and the second model transconductor.

11. A transconductor circuit as claimed in claim 10 comprising a second signal conditioner having an input connected to the output of the first model transconductor and wherein the second servo circuit is connected to sense the version of the voltage at the output of the first model transconductor provided by the second signal conditioner.

12. A transconductor circuit as claimed in claim 10 wherein the signal conditioner comprises a low pass filter.

13. A transconductor circuit as claimed in claim 12 wherein the signal conditioner comprises two low pass filters connected to receive respective ones of a pair of inputs, the input signal being represented by the difference in voltage between those inputs, and to provide respective outputs, and comprises two high pass filters each connected to receive the signal input to a respective one of the low pass filters and to inject a high pass filtered version of that into the input of the other low pass filter.

14. A transconductor circuit as claimed in claim 9 wherein the condition sensed is a voltage at a node of the output transconductor.

15. A transconductor circuit as claimed in claim 9 wherein the output transconductor and the model transconductor each comprises a transconductor transistor having a control input connected to receive the control output from the predistortion circuit and a current output and a cascade transistor connected to pass the current output from the transconductor transistor, the servo circuit being connected to sense the voltage at a node between the transconductor transistor and the cascode transistor of the output transconductor and to apply that voltage to that node between those transistors of the model transconductor.

16. A transconductor circuit as claimed in claim 1 wherein the output transconductor and the model transconductor each comprises a transconductor transistor having a control input connected to receive the control output from the feedback network, whether an original or modified version thereof, and a current output.

17. A transconductor circuit as claimed in claim 16 wherein the output transconductor and the model transconductor each comprises a cascode transistor connected to pass the current output from the transconductor transistor.

18. A transconductor circuit as claimed in claim 1 wherein at least one of the said transconductors comprises a bipolar transistor.

19. A transconductor circuit as claimed in claim 18 wherein at least one of the said transconductors comprises a bipolar transistor having common emitter connection.

20. A transconductor circuit as claimed in claim 1 wherein at least one of the said transconductors comprises a field effect transistor.

21. A transconductor circuit as claimed in claim 20 wherein at least one of the said transconductors comprises a field effect transistor having common source connection.

22. A transconductor circuit as claimed in claim 1 wherein the model transconductor comprises a component that has identical or scaled geometry compared to a respective that the output transconductor comprises.

23. A transconductor circuit as claimed in claim 1, wherein the circuit is an integrated circuit.

24. A method of controlling an output transconductor comprising: providing an output transconductor and a model transconductor having an input voltage to output current characteristic where the output current is related to that of the output transconductor by a constant factor, which factor includes a factor of one, receiving an input control signal, sensing the output of the model transconductor, providing, in response to the input control signal and to a signal indicative of the output of the model transconductor, a transconductor control signal to control the output of the model transconductor to be linear with respect to the input control signal, applying the transconductor control signal to the output transconductor to control the output thereof, and low pass filtering the transconductor control signal before it is applied to the output transconductor.

25. A method as claimed in claim 24 comprising loading the output of the model transconductor with a linear impedance.

26. A method as claimed in claim 24 wherein the low pass filtering comprises filtering a pair of inputs the difference between which represents the transconductor control signal with respective low pass filters and injecting high pass filtered versions of the signals on those two inputs into the one of the low pass filters which filters the other one of those signals.

27. A method of controlling an output transconductor comprising: providing an output transconductor and a model transconductor having an input voltage to output current characteristic where the output current is related to that of the output transconductor by a constant factor, which factor includes a factor of one, receiving an input control signal, sensing the output of the model transconductor, providing, in response to the input control signal and to a signal indicative of the output of the model transconductor, a transconductor control signal to control the output of the model transconductor to be linear with respect to the input control signal, applying the transconductor control signal to the output transconductor to control the output thereof, sensing an operating condition of the output transconductor and applying that operating condition to the model transconductor.

28. A method as claimed in claim 27 comprising providing first and second model transconductors controlled by the transconductor control signal, and conditioning the transconductor control signal before it is applied to the second said model transconductor and the output transconductor.

29. A method as claimed in claim 28 comprising serving the voltage from the output of the second model transconductor to that at the output of the first model transconductor.

30. A method as claimed in claim 29 comprising conditioning the voltage at the output of the first model transconductor and serving the voltage at the output of the second model transconductor to that at the output of the first model transistor in its conditioned version.

31. A method as claimed in claim 24 comprising driving a mixer input with the output of the output transconductor.

* * * * *